United States Patent
Jidhage et al.

(10) Patent No.: US 11,018,782 B2
(45) Date of Patent: May 25, 2021

(54) METHOD OF DETERMINING SIGN OF A CALIBRATION COMPENSATION

(71) Applicant: Telefonaktiebolaget LM Ericsson (publ), Stockholm (SE)

(72) Inventors: Henrik Jidhage, Mölndal (SE); Henrik Hallenberg, Lindome (SE); Stefan Johansson, Romelanda (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 259 days.

(21) Appl. No.: 16/303,431

(22) PCT Filed: May 24, 2016

(86) PCT No.: PCT/EP2016/061677
§ 371 (c)(1),
(2) Date: Nov. 20, 2018

(87) PCT Pub. No.: WO2017/202453
PCT Pub. Date: Nov. 30, 2017

(65) Prior Publication Data
US 2020/0336224 A1 Oct. 22, 2020

(51) Int. Cl.
*H04B 17/21* (2015.01)
*H04B 17/12* (2015.01)
(Continued)

(52) U.S. Cl.
CPC .......... *H04B 17/21* (2015.01); *G01R 29/10* (2013.01); *G01R 35/005* (2013.01); *H04B 17/12* (2015.01); *H04B 17/14* (2015.01)

(58) Field of Classification Search
CPC ........ H04B 17/21; H04B 17/12; H04B 17/14; G01R 29/10; G01R 35/005
See application file for complete search history.

(56) References Cited

U.S. PATENT DOCUMENTS

2010/0136902 A1* 6/2010 Barak ............... H04B 7/18513
455/12.1
2012/0154206 A1 6/2012 Medina Sanchez

FOREIGN PATENT DOCUMENTS

WO 2012074446 A1 6/2012

OTHER PUBLICATIONS

International Search Report and Written Opinion dated Jan. 25, 2017 issued in International Application No. PCT/EP2016/061677. (11 pages).

(Continued)

*Primary Examiner* — Timothy A Brainard
(74) *Attorney, Agent, or Firm* — Rothwell, Figg, Ernst & Manbeck, P.C.

(57) ABSTRACT

A method (20) of determining sign of a calibration compensation for use in an antenna system (10) is provided, the antenna system (10) comprising individually calibrated subarrays (2a, 2b). The method (20) comprises selecting (21) a set of antenna elements comprising two neighboring antenna elements of the first subarray (2a) and two neighboring antenna elements of the second subarray (2b); measuring (22): in a selected antenna element of the first subarray (2a) a first received signal $Y_{31}$ as transmitted from the other selected antenna element of the first subarray (2a) and a second received signal $Y_{34}$ as transmitted from the neighboring antenna element of the second subarray (2b), and in a selected antenna element of the second subarray (2b) a third received signal $Y_{21}$ as transmitted from the other selected antenna element of the second subarray (2b) and a fourth received signal $Y_{24}$ as transmitted from the neighboring antenna element of the first subarray (2a); calculating (23) for the first calibrated subarray (2a) a downlink compensation value $\Delta t_a$ and an uplink compensation value $\Delta r_a$ based on measurement values obtained from the measuring (22), each compensation value $\Delta t_a$, $\Delta r_a$ having a positive and (Continued)

a negative solution; determining (24) a first compensation value estimate, $k_t$, for downlink compensation and a second compensation value estimate, $k_r$, for uplink compensation; and determining (25) the sign of the downlink compensation value $At_a$ and the uplink compensation value $Ar_a$ based on distance between the first compensation value estimate $k_t$ and the downlink compensation value, $At_a$, and the distance between the second compensation value estimate, $k_r$, and the uplink compensation value $Ar_a$.

15 Claims, 3 Drawing Sheets

(51) Int. Cl.
  *H04B 17/14* (2015.01)
  *G01R 29/10* (2006.01)
  *G01R 35/00* (2006.01)

(56) References Cited

OTHER PUBLICATIONS

Shipley, C. et al., "Mutual Coupling-Based Calibration of Phased Array Antennas", Phased Array Systems and Technology, 2000. Proceedings. IEEE International Conference on Dana Point, CA, USA May 21-25, pp. 529-532, XP010504647. (4 pages).
Vieira, J. et al., "Reciprocity calibration methods for Massive MIMO based on antenna coupling", Lund University (2014). (6 pages).
Aumann, H. et al., "Phased Array Antenna Calibration and Pattern Prediction Using Mutual Coupling Measurements", IEEE Transactions on Antennas and Propagation, vol. 37, No. 7 (Jul. 1989). (7 pages).
European Communication dated Jun. 17, 2020, issued in European Patent Application No. 16725830.0, 7 pages.
Aaron Kerkhoff "S Parameter Extraction Approach to the Reduction of Dipole Antenna Measurements" Feb. 14, 2008, (Feb. 14, 2009), XP055704220, 7 pages.

\* cited by examiner

METHOD OF DETERMINING SIGN OF A CALIBRATION COMPENSATION

CROSS REFERENCE TO RELATED APPLICATION(S)

This application is a 35 U.S.C. § 371 National Stage of International Patent Application No. PCT/EP2016/061677, filed May 24, 2016, designating the United States.

TECHNICAL FIELD

The technology disclosed herein relates generally to the field of antenna systems, and in particular to a method of determining sign of a calibration compensation, a control device, computer program and computer program products.

BACKGROUND

Antenna systems for e.g. wireless communication need to be properly calibrated in order to work with best possible performance. Having calibrated systems are becoming increasingly important since, in future wireless communication systems, the number of branches increases and since beamforming is to be supported.

Calibration methods using mutual coupling are known, i.e. methods based on electromagnetic interaction between antenna elements in an antenna array. These calibration methods work well for symmetrical antenna arrays where identical coupling occurs between several elements by virtue of symmetry. Specifically, since the antenna elements are symmetrically placed having the same distance to each neighboring antenna element, the mutual coupling is identical for all elements.

However, when applying such calibration method to lattices that are not symmetrical the result is two or more subarrays that are individually calibrated, but that has no calibration between them. Solutions addressing this are known, e.g. as described in Woods et. al, Mutual coupling-based calibration of phase array antennas, IEEE conference on phased array systems and technology, May 21-25, 2000. A shortcoming in common for these solutions in turn is that the sign of the obtained compensation is unknown. That is, at (inter-)calibration of the subarrays, the sign of the compensation may be such that the compensation is 180 degrees out of phase, which results in very poor reception.

To establish the sign by performing far-field test range is also a known method but this is a very expensive solution and alternatives are needed.

SUMMARY

An objective of embodiments herein is to provide methods and devices for determining a proper sign of a calibration compensation to be applied. This objective, and others, is achieved by the method, network node, computer programs and computer program products according to the appended independent claims, and by the embodiments according to the dependent claims.

The objective is according to an aspect achieved by a method of determining sign of a calibration compensation for use in an antenna system. The antenna system comprises a first individually calibrated subarray and a second individually calibrated subarray. The method is performed in a control device and comprises: (1) selecting a set of antenna elements comprising two neighboring antenna elements of the first subarray and two neighboring antenna elements of the second subarray, (2) measuring: in a selected antenna element of the first subarray a first received signal as transmitted from the other selected antenna element of the first subarray and a second received signal as transmitted from the neighboring antenna element of the second subarray, and in a selected antenna element of the second subarray a third received signal as transmitted from the other selected antenna element of the second subarray and a fourth received signal as transmitted from the neighboring antenna element of the first subarray, (3) calculating for the first calibrated subarray a downlink compensation value and an uplink compensation value based on measurement values obtained from the measuring, each compensation value having a positive and a negative solution, (4) determining a first compensation value estimate for downlink compensation and a second compensation value estimate for uplink compensation, and (5) determining the sign of the downlink compensation value and the uplink compensation value based on distance between the first compensation value estimate and the downlink compensation value and the distance between the second compensation value estimate and the uplink compensation value.

The method brings about several advantages. For instance, the method is faster and cheaper than over-the-air alternatives since no additional test setup is required. Another advantage is that the method can be used for in-field calibration, which is not conceivable for existing solutions. That is, it is not reasonable to use the far-field testing as in known art to repeat a calibration. Thus, in contrast to known art, the presented method can be used repeatedly for calibrating the same antenna system and hence account for any changes that may have occurred. Such maintaining of calibration may be important e.g. in order to account for calibration changes due to, for instance, temperature drifts.

The objective is according to an aspect achieved by a computer program product comprising a computer program as above and a computer readable means on which the computer program is stored.

The objective is according to an aspect achieved by a control device for determining sign of a calibration compensation for use in an antenna system. The antenna system comprises a first individually calibrated subarray and a second individually calibrated subarray. The control device is configured to: (1) select a set of antenna elements comprising two neighboring antenna elements of the first subarray and two neighboring antenna elements of the second subarray, (2) measure: in a selected antenna element of the first subarray a first received signal as transmitted from the other selected antenna element of the first subarray and a second received signal as transmitted from the neighboring antenna element of the second subarray, and in a selected antenna element of the second subarray a third received signal as transmitted from the other selected antenna element of the second subarray and a fourth received signal as transmitted from the neighboring antenna element of the first subarray, (3) calculate for the first calibrated subarray a downlink compensation value and an uplink compensation value based on measurement values obtained from the measuring, each compensation value having a positive and a negative solution, (4) determine a first compensation value estimate for downlink compensation and a second compensation value estimate for uplink compensation, and (5) determine the sign of the downlink compensation value and the uplink compensation value based on distance between the first compensation value estimate and the downlink compensation value and the distance between the second compensation value estimate and the uplink compensation value.

Further features and advantages of the embodiments of the present teachings will become clear upon reading the following description and the accompanying drawings.

DETAILED DESCRIPTION

Figure 1A:
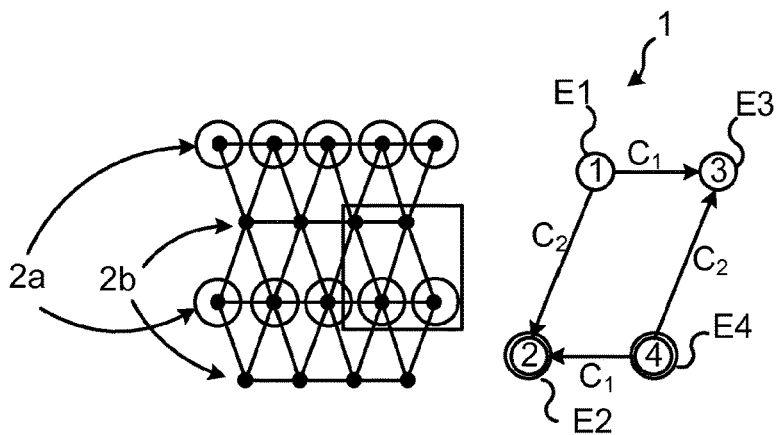
FIG. 1a illustrates part of the antenna array.

In the following description, for purposes of explanation and not limitation, specific details are set forth such as particular architectures, interfaces, techniques, etc. in order to provide a thorough understanding. In other instances, detailed descriptions of well-known devices, circuits, and methods are omitted so as not to obscure the description with unnecessary detail. Same reference numerals refer to same or similar elements throughout the description.

Briefly, basic knowledge of the mutual coupling between the antenna elements that is used in measurements to calibrate two or more subarrays is, according to embodiments described herein, used in order to reveal the proper sign of the calibration compensation.

FIG. 1a illustrates part of the antenna array. The antenna array 1 comprises a number of antenna elements, every other row of antenna elements indicated by blank circles and every other row of antenna elements indicated by filled in circles. The two rows of elements indicated by blank circles represents a first subarray 2a and the two rows of elements indicated by filled in circles represents a second subarray 2b. The elements within each respective subarray 2a, 2b are calibrated to each other. This calibration may be performed by using existing symmetry based calibration methods. For instance, consider an array having array elements uniformly spaced and having identical symmetric radiation patterns, and with the ability to transmit with one element and simultaneously receive with another. When measuring a received signal Y from an element to its adjacent elements different values is typically obtained, due to e.g. hardware differences. Any differences in Y between element m and n and between m and n+1 are related to differences between the receiving element signal paths n and n+1 and calibration can be made based on this. This example of an existing calibration method that may be used is described more in detail in Aumann et. al., Phased Array Antenna Calibration and Pattern Prediction Using Mutual Coupling Measurements, IEEE transactions on antennas and propagation, Vol 37 No7 Jul. 1989.

Among these calibrated subarrays 2a, 2b, four (4) elements are then selected. This selection can be made e.g. by selecting two elements from each subarray. The elements are selected such as to provide the symmetrical coupling for C1 and C2, as shown in FIG. 1a.

At the right-hand side of FIG. 1a four elements have accordingly been selected, e.g. as described above. The mutual coupling between elements indicated by E1 and E3 is denoted C1, and the mutual coupling between elements E1 and E2 is denoted C2. By virtue of symmetry, the mutual coupling between elements E2 and E4 is assumed to be C1 and the mutual coupling between elements E3 and E4 is assumed to be C2.

Figure 1B:
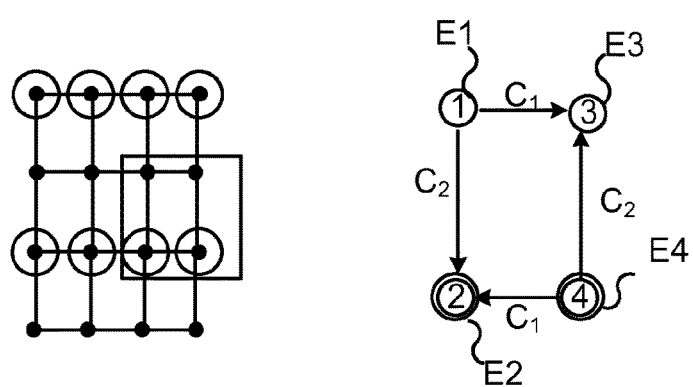
FIG. 1b illustrates an antenna array configuration.

FIG. 1b illustrates an alternative antenna array configuration. It is noted that the present teachings are not restricted to the particular antenna array configuration illustrated in FIG. 1a. Hence, while the array configuration of FIG. 1a is a staggered type of configuration, the array configuration of FIG. 1b is a regular configuration. The present teachings are applicable to still further types of antenna configurations. In this context it may be noted that two antenna elements are denoted as "neighboring elements" when selecting two elements that have symmetric coupling between them. Hence, two equidistant neighboring elements may, for instance, be the closest two antenna elements in any direction (i.e. two adjacent antenna elements), or two neighboring elements may be two non-nearest neighboring elements, for instance being two "hops" apart in any direction, i.e. having one element in between (and thus being non-adjacent neighbors). As long as there is a symmetric coupling between two elements they are denoted neighboring for the purpose of the present invention. For instance, any antenna element (except the outermost) of the antenna configurations shown in FIGS. 1a and 1b thus has at least eight (8) neighboring antenna elements.

Figure 2:
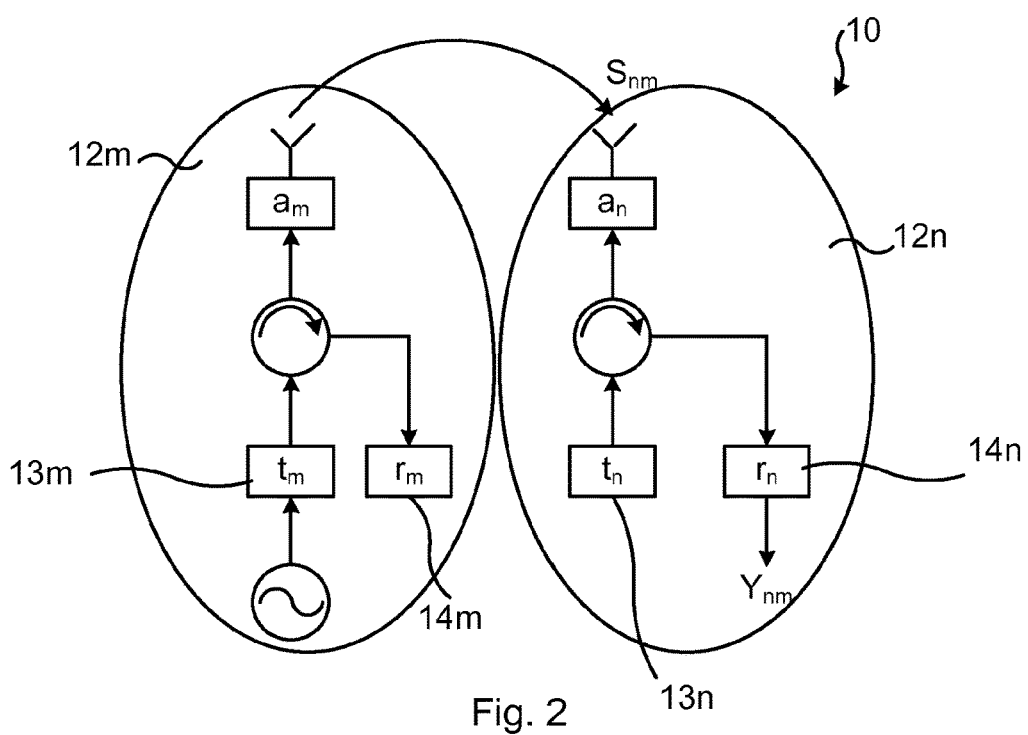
FIG. 2 illustrates a functional view of an antenna system.

FIG. 2 illustrates a functional view of an antenna system 10. The antenna system 10 comprises a number of antenna branches 12m, 12n (two shown in the figure), each comprising e.g. transmitting circuitry, receiving circuitry, antenna feed lines etc. In FIG. 2 a first antenna branch 12m and a second antenna branch 12n are shown. The first antenna branch 12m comprises a first transmitter 13m, a first receiver 14m and a first antenna feed line, which is represented by a variable $a_m$. The first antenna branch 12m may comprise further components and circuitry, e.g. a circulator as shown in FIG. 2. The second antenna branch 12n comprises a second transmitter 13n, a second receiver 14n and a second antenna feed line, which is represented by a variable $a_n$. The second antenna branch 12n may comprise further components and circuitry, e.g. a circulator as shown in FIG. 2.

The signal is affected on its way from an antenna port through the transmitting circuitry and to the radiating antenna element, and also on its way from the radiating antenna element to the receiving circuitry and to the receiving antenna port. The signal is, for instance, affected by imbalances of circuitry, filters, amplifiers etc. of the transmitter and receiver and may, for instance, lead to the signal experiencing angular displacement. In short, there may be considerable amplitude and phase differences among the antenna elements, e.g. due to the different hardware of the antenna branches. The way a signal is affected when sent by a transmitter and received by a receiver is herein expressed by the complex variables $t_m$ and $r_m$, respectively.

The state variables $t_m$ and $r_m$ comprise previous state variables and a calibration compensation factor. For instance, when initially calibrating an antenna system, the state variables comprises original state (uncalibrated) variables $t_{m0}$ and $r_{m0}$ and a respective calibration compensation factor Δt and Δr (which initially are equal to 1). The state variables can be expressed according to the following equations [1], [2]:

$$t_m = t_{m0} \cdot \Delta t_m \quad [1]$$

$$t_m = t_{m0} - \Delta t_m \quad [2]$$

It is noted that the compensations are time dependent. Measurements may be performed with an "old" compensation. For instance, if a first compensation is made and a new measurement shows that the result is still not according to a desired target value, then a new calibration is made, and the new compensation may include the previous compensation. Any new compensation is thus based on the existing compensation (if any).

The equations [3], [4] below show how a state variable $t_m$ ($t_1$), which included an original compensation $\Delta t_m(t_1)$, is used to calculate a new compensation $\Delta t_m(t_2)$.

$$t_m(t_1) = t_{m0} \cdot \Delta t_m(t_1) \quad [3]$$

$$t_m(t_2) = (t_{m0} \cdot \Delta t_m(t_1)) \cdot \Delta t_m(t_2) \quad [4]$$

With reference still to FIG. 2, a signal $Y_{nm}$ is a signal received using transmitter 13m (variable $t_m$) of the m:th antenna branch 12m and received by receiver 14n (variable $r_n$) of the n:th antenna branch 12n. Measurements $Y_{ij}$ performed using the four elements E1, E2, E3, E4 can be expressed with the following equations [5]-[8]:

$$Y_{31} = t_1 \cdot C_1 \cdot r_3 \quad [5]$$

$$Y_{21} = t_1 \cdot C_2 \cdot r_2 \quad [6]$$

$$Y_{34} = t_4 \cdot C_2 \cdot r_3 \quad [7]$$

$$Y_{24} = t_4 \cdot C_1 \cdot r_2 \quad [8]$$

It is noted that C1, C2 in FIGS. 1a, 1b are expressed in terms of S and a in FIG. 2. S-parameters describe an input-output relationship between ports of the antenna system 10. In FIG. 2 only two ports are shown, Port m and Port n, and hence only two transmit/receive (T/R) units 12m, 13m; 13n, 14n. $S_{nm}$ represents the power transferred from Port m to Port n. $a_m$ and $a_n$ are variables representing the respective antenna feed lines.

The above measurements are, in various embodiments, used to calculate compensations in order to calibrate the individual subarrays 2a, 2b.

If, for instance, all elements belonging to the first subarray 2a that also comprises the transmit element E4 and the receive element E2 (the elements shown by non-filled circles) are corrected with $\Delta t_{2m}$, and $\Delta r_{2m}$, a complete array calibration is achieved, i.e. the first and second subarrays 2a, 2b are calibrated. The below equations [9], [10] can be used for solving the transmit compensation $\Delta t_{2m}$ for transmit element E4, and receive compensation $\Delta r_{2m}$ for receive element E2. Below equations are generalized to $\Delta t_m$, $\Delta r_m$:

$$\left(\frac{t_1}{t_4}\right)^2 = \frac{Y_{31} \cdot Y_{21}}{Y_{24} \cdot Y_{34}} \Rightarrow \frac{t_1}{t_4} = \pm\sqrt{\frac{Y_{31} \cdot Y_{21}}{Y_{24} \cdot Y_{34}}} \Rightarrow \Delta t_m = \pm\sqrt{\frac{Y_{31} \cdot Y_{21}}{Y_{24} \cdot Y_{34}}} \quad [9]$$

$$\left(\frac{r_3}{r_2}\right)^2 = \frac{Y_{31} \cdot Y_{34}}{Y_{24} \cdot Y_{21}} \Rightarrow \frac{r_3}{r_2} = \pm\sqrt{\frac{Y_{31} \cdot Y_{34}}{Y_{24} \cdot Y_{21}}} \Rightarrow \Delta r_m = \pm\sqrt{\frac{Y_{31} \cdot Y_{34}}{Y_{24} \cdot Y_{21}}}, \quad [10]$$

wherein $Y_{ij}$ are the values of the measurements performed using the selected antenna elements $E_i$, $t_i$ is a variable representing transmitter $t_i$ of selected antenna element $E_i$ and $r_i$ is a variable representing receiver $r_i$ of selected antenna element $E_i$.

As has been mentioned and as can be seen in the above equations, two solutions exist for each compensation $\Delta t_m$, $\Delta r_m$. The wrong solution will be 180 degrees incorrect, hence the sign ambiguity. It is assumed that the relation between the coupling C1 and C2 is known (i.e. C2/C1). This relation can be found, for instance, with simple s-parameter measurements and using e.g. a Vector Network Analyzer, or by performing simulations, e.g. electromagnetic software (EM-SW) simulations. It is noted that this knowledge, i.e. this relation, may also be known "per design", and that detailed measurements of each individual unit are hence not needed for the purpose of deciding sign according to the present teachings.

It is possible to calculate compensation value estimates based on the coupling difference according to the following equations [11], [12]:

$$k_t = \frac{t_1}{t_4} = \frac{C_2 \cdot Y_{31}}{C_1 \cdot Y_{34}} \quad [11]$$

$$k_r = \frac{r_3}{r_2} = \frac{C_2 \cdot Y_{31}}{C_1 \cdot Y_{21}} \quad [12]$$

The above compensation value estimates $k_t$, $k_r$ are not intended for use in calibration of the antenna branches, but to find out the proper sign of the original compensation values $\Delta t_m$ and $\Delta r_m$. The decision whether to use the "+" solution or the "−" solution is taken based on the distance between $k_t$ and $\Delta t_m$ and between $k_r$ and $\Delta r_m$. Simply put, the closest solution is selected.

The above can be expressed by the following equations [13], [14]:

$$\Delta t = \begin{cases} +\sqrt{\frac{Y_{31} \cdot Y_{21}}{Y_{24} \cdot Y_{34}}}, & \text{if } |k_t - \Delta t_a^+| < |k_t - \Delta t_a^-| \\ -\sqrt{\frac{Y_{31} \cdot Y_{21}}{Y_{24} \cdot Y_{34}}}, & \text{if } |k_t - \Delta t_a^+| \geq |k_t - \Delta t_a^-| \end{cases} \quad [13]$$

$$\Delta r = \begin{cases} +\sqrt{\frac{Y_{31} \cdot Y_{34}}{Y_{24} \cdot Y_{21}}}, & \text{if } |k_r - \Delta r_a^+| < |k_r - \Delta r_a^-| \\ -\sqrt{\frac{Y_{31} \cdot Y_{34}}{Y_{24} \cdot Y_{21}}}, & \text{if } |k_r - \Delta r_a^+| \geq |k_r - \Delta r_a^-| \end{cases} \quad [14]$$

where $$\Delta t_a^+ = +\sqrt{\frac{Y_{31} \cdot Y_{21}}{Y_{24} \cdot Y_{34}}},$$

$$\Delta t_a^- = -\sqrt{\frac{Y_{31} \cdot Y_{21}}{Y_{24} \cdot Y_{34}}},$$

$$\Delta r_a^+ = +\sqrt{\frac{Y_{31} \cdot Y_{34}}{Y_{24} \cdot Y_{21}}}, \text{ and}$$

$$\Delta r_a^- = -\sqrt{\frac{Y_{31} \cdot Y_{34}}{Y_{24} \cdot Y_{21}}}.$$

For instance, for Δr: select the positive solution (positive compensation value) if $|k_r-\Delta r_m^+|<|k_r-\Delta r_m^-|$, i.e. if the absolute value of the difference between the compensation value estimate $k_r$ and the positive compensation value $\Delta r_m^+$ is smaller than the absolute value of the difference between the compensation value estimate $k_r$ and the negative compensation value $\Delta r_m^-$, and select the negative solution (negative compensation value) if $|k_r-\Delta r_m^+|\geq|k_r-\Delta r_m^-|$, i.e. if the absolute value of the difference between the compensation value estimate $k_r$ and the positive compensation value $\Delta r_m^+$ is larger than or equal to the absolute value of the difference between the compensation value estimate $k_r$ and the negative compensation value $\Delta r_m^-$.

The compensation value for Δt is selected in corresponding manner, as seen in equation [13] above.

Figure 3:
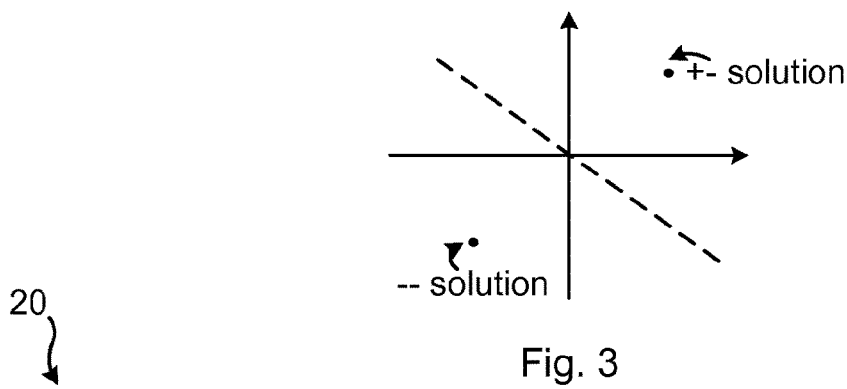
FIG. 3 illustrates selection of solution to equations.

FIG. 3 illustrates graphically a selection of solution to the equations above. The dashed line may be seen as a "decision line", and the dots indicate the two possible solutions to select among (one giving 180 degrees wrong signal) and the compensation value estimate $k_{t/r}$ being the compensation value estimate closest to the solution to select. If the distance, as defined in equations [13] and [14]), from the compensation value estimate $k_{t/r}$ to the positive solution (indicated "+ solution" in the figure) is smaller than the distance from the compensation value estimate $k_{t/r}$ to the minus solution (indicated "− solution" in the figure) then the corresponding compensation is selected.

Figure 4:
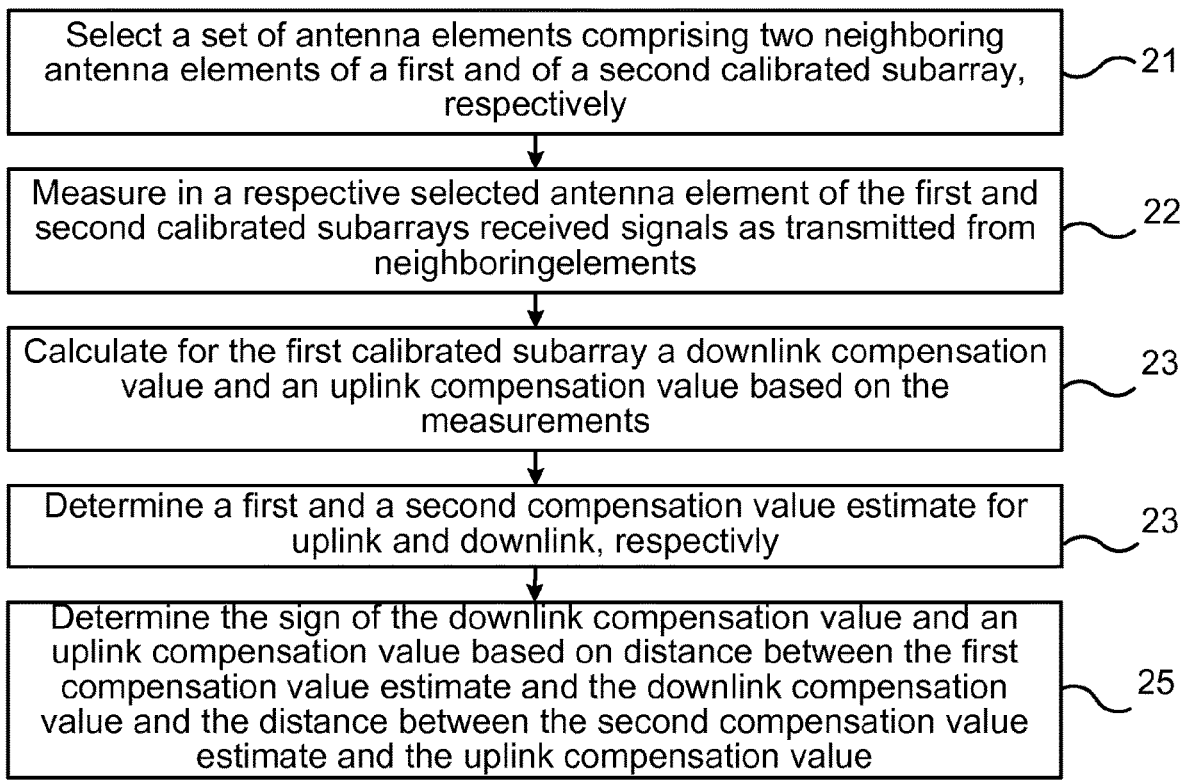
FIG. 4 illustrates a flow chart over steps of an embodiment of a method in a network device in accordance with the present teachings.

The various embodiments and features that have been described may be combined in different ways, examples of which are given next, with reference first to FIG. 4.

FIG. 4 illustrates a flow chart over steps of an embodiment of a method in a network device in accordance with the present teachings. The method 20 of determining sign of a calibration compensation for use in an antenna system 10 is provided. The antenna system 10 comprises a first individually calibrated subarray 2a and a second individually calibrated subarray 2b. The method 20 may performed in a control device 30.

The method 20 comprises selecting 21 a set of antenna elements comprising two neighboring antenna elements of the first subarray 2a and two neighboring antenna elements of the second subarray 2b. As described earlier, this selection may be performed in known manner. It is noted that "neighboring" antenna elements are any two selected antenna elements that have symmetric coupling between them. If a strong coupling is desired, the neighboring antenna elements should be close to each other. If, on the other hand, a lower symmetric coupling is desired, then two antenna elements should be selected that have symmetric coupling but are further apart from each other. This has also been described earlier, e.g. with reference to FIG. 1b (C1, C2).

The method 20 comprises measuring 22: in a selected antenna element of the first subarray 2a a first received signal $Y_{31}$ as transmitted from the other selected antenna element of the first subarray 2a and a second received signal $Y_{34}$ as transmitted from the neighboring antenna element of the second subarray 2b, and in a selected antenna element of the second subarray 2b a third received signal $Y_{21}$ as transmitted from the other selected antenna element of the second subarray 2b and a fourth received signal $Y_{24}$ as transmitted from the neighboring antenna element of the first subarray 2a.

The method 20 comprises calculating 23 for the first calibrated subarray 2a a downlink compensation value $\Delta t_a$ and an uplink compensation value $\Delta r_a$ based on measurement values obtained from the measuring 22, each compensation value $\Delta t_a$, $\Delta r_a$ having a positive and a negative solution.

The method 20 comprises determining 24 a first compensation value estimate, $k_t$, for downlink compensation and a second compensation value estimate, $k_r$, for uplink compensation.

The method 20 comprises determining 25 the sign of the downlink compensation value $\Delta t_a$ and the uplink compensation value $\Delta r_a$ based on distance between the first compensation value estimate $k_t$ and the downlink compensation value, $\Delta t_a$, and the distance between the second compensation value estimate, $k_r$, and the uplink compensation value $\Delta r_a$.

The method 20 provides a number of advantages. Calibration of many antenna arrays is typically performed once during the manufacturing process, and requires large near-field or far-field antenna ranges. In contrast to this, the method is faster and cheaper than over-the-air alternatives since no additional test setup is required. Another advantage is that the method can be used for in-field calibration, which is not feasible for existing solutions.

In an embodiment, the determining 25 the sign of the calibration downlink compensation value $\Delta t_a$ comprises determining the absolute value of the difference between the determined compensation value estimate $k_t$ and the positive compensation value $\Delta t_a^+$ and the absolute value of the difference between the determined compensation value estimate $k_t$ and the negative compensation value $\Delta t_a^-$, and determining the sign of the calibration downlink compensation $\Delta t_a$ to be positive if the absolute value of the difference between the determined compensation value estimate $k_t$ and the positive compensation value $\Delta t_a^+$ is smaller than the absolute value of the difference between the determined compensation value estimate $k_t$ and the negative compensation value $\Delta t_a^-$, and else determining the sign of the calibration downlink compensation $\Delta t_a$ to be negative. This embodiment was described earlier, e.g. with reference to equation [13]. A sign of the calibration uplink compensation value can be determined in a corresponding way, e.g. according to equation [14].

In various embodiments, the calculating 23 for the first calibrated subarray 2a a downlink compensation value $\Delta t_a$ and an uplink compensation value $\Delta r_a$ based on the measurements comprises using equations:

$$\Delta t_a = \pm \sqrt{\frac{Y_{31} \cdot Y_{21}}{Y_{24} \cdot Y_{34}}}$$

$$\Delta r_a = \pm \sqrt{\frac{Y_{31} \cdot Y_{34}}{Y_{24} \cdot Y_{21}}},$$

wherein $Y_{ij}$ are the values of the measurements performed using the selected set of antenna elements.

In various embodiments, the determining 25 the sign of the calibration compensation for the first subarray 2a comprises using equations:

$$\Delta t = \begin{cases} +\sqrt{\frac{Y_{31} \cdot Y_{21}}{Y_{24} \cdot Y_{34}}}, & \text{if } |k_t - \Delta t_a^+| < |k_t - \Delta t_a^-| \\ -\sqrt{\frac{Y_{31} \cdot Y_{21}}{Y_{24} \cdot Y_{34}}}, & \text{if } |k_t - \Delta t_a^+| \geq |k_t - \Delta t_a^-| \end{cases} \quad [13]$$

-continued $$\Delta r = \begin{cases} +\sqrt{\frac{Y_{31} \cdot Y_{34}}{Y_{24} \cdot Y_{21}}}, & \text{if } |k_r - \Delta r_a^+| < |k_r - \Delta r_a^-| \\ -\sqrt{\frac{Y_{31} \cdot Y_{34}}{Y_{24} \cdot Y_{21}}}, & \text{if } |k_r - \Delta r_a^+| \geq |k_r - \Delta r_a^-| \end{cases}, \quad [14]$$

wherein $Y_{ij}$ are the values of the measurements performed using the selected set of antenna elements, $\Delta t_a$ is the downlink compensation value and $\Delta r_a$ is the uplink compensation value. More specifically:

$$\Delta t_a^+ = +\sqrt{\frac{Y_{31} \cdot Y_{21}}{Y_{24} \cdot Y_{34}}},$$

$$\Delta t_a^- = -\sqrt{\frac{Y_{31} \cdot Y_{21}}{Y_{24} \cdot Y_{34}}},$$

$$\Delta r_a^+ = +\sqrt{\frac{Y_{31} \cdot Y_{34}}{Y_{24} Y_{21}}}, \text{ and}$$

$$\Delta r_a^- = -\sqrt{\frac{Y_{31} \cdot Y_{34}}{Y_{24} \cdot Y_{21}}}.$$

In various embodiments, the determining 24 the first compensation value estimate, $k_t$, for downlink compensation and the second compensation value estimate, $k_r$, for uplink, comprises using equations:

$$k_t = \frac{C_2 \cdot Y_{31}}{C_1 \cdot Y_{34}}$$

$$k_r = \frac{C_2 \cdot Y_{31}}{C_1 \cdot Y_{21}}$$

wherein $C_1$ is the mutual coupling between the selected two neighboring elements of the same subarray 2a, 2b and $C_2$ is the mutual coupling between a selected antenna element of the first subarray 2a and a neighboring antenna element of the second subarray 2b. $C_1$ is thus the mutual coupling between the selected two neighboring antenna elements of the first subarray 2a, as well as the mutual coupling between the selected two neighboring antenna elements of the second subarray 2b.

In a variation of the above embodiment, the method 20 comprises obtaining the mutual couplings $C_1$, C2 by s-parameter measurements or by software simulations.

In various embodiments, the method 20 comprises using the calibration downlink compensation value $\Delta t_a$ and the uplink compensation value $\Delta r_a$ for calibrating the first subarray 2a with the determined sign, hence obtaining array calibration between the first and second subarrays 2a, 2b.

Figure 5:
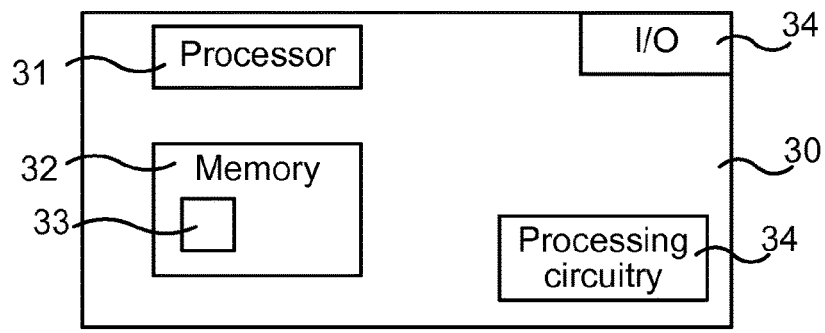
FIG. 5 illustrates schematically a network device and means for implementing embodiments of the method in accordance with the present teachings.

FIG. 5 illustrates schematically a network device and means for implementing embodiments of the method in accordance with the present teachings.

The control device 30 comprises a processor 31 comprising any combination of one or more of a central processing unit (CPU), multiprocessor, microcontroller, digital signal processor (DSP), application specific integrated circuit etc. capable of executing software instructions stored in a memory 32 which can thus be a computer program product. The processor 31 can be configured to execute any of the various embodiments of the method 10 for instance as described in relation to FIG. 4.

The memory 32 of the control device 30 can be any combination of read and write memory (RAM) and read only memory (ROM), Flash memory, magnetic tape, Compact Disc (CD)-ROM, digital versatile disc (DVD), Blu-ray disc etc. The memory 13 may also comprise persistent storage, which, for example, can be any single one or combination of magnetic memory, optical memory, solid state memory or even remotely mounted memory.

The control device 30 may comprise an interface 34, e.g. an input/output device for communication with other devices and/or functions. The interface 34 may, for instance, comprise a protocol stack, for communication with other devices or entities. The interface may be used for receiving data input and for outputting data.

The control device 30 may comprise additional processing circuitry, schematically indicated at reference numerals 34 for implementing the various embodiments according to the present teachings.

A control device 30 for determining sign of a calibration compensation for use in an antenna system 10 is provided. The antenna system 10 comprises a first individually calibrated subarray 2a and a second individually calibrated subarray 2b. The control device 30 is configured to: (1) select a set of antenna elements comprising two neighboring antenna elements of the first subarray 2a and two neighboring antenna elements of the second subarray 2b, (2) measure: in a selected antenna element of the first subarray 2a a first received signal $Y_{31}$ as transmitted from the other selected antenna element of the first subarray 2a and a second received signal $Y_{34}$ as transmitted from the neighboring antenna element of the second subarray 2b, and in a selected antenna element of the second subarray 2b a third received signal $Y_{21}$ as transmitted from the other selected antenna element of the second subarray 2b and a fourth received signal $Y_{24}$ as transmitted from the neighboring antenna element of the first subarray 2a, (3) calculate for the first calibrated subarray 2a a downlink compensation value $\Delta t_a$ and an uplink compensation value $\Delta r_a$ based on measurement values obtained from the measuring 22, each compensation value $\Delta t_a$, $r_a$ having a positive and a negative solution, (4) determine a first compensation value estimate, $k_t$, for downlink compensation and a second compensation value estimate, $k_r$, for uplink compensation, and (5) determine the sign of the downlink compensation value $\Delta t_a$ and the uplink compensation value $\Delta r_a$ based on distance between the first compensation value estimate $k_t$ and the downlink compensation value, $\Delta t_a$, and the distance between the second compensation value estimate, $k_r$, and the uplink compensation value $r_a$.

The control device 30 may be configured to perform the above steps e.g. by comprising one or more processors 31 and memory 32, the memory 32 containing instructions executable by the processor 31, whereby the control device 30 is operative to perform the steps. That is, in an embodiment, a control device is provided or determining sign of a calibration compensation for use in an antenna system. The control device comprises one or more processors and memory, the memory containing instructions executable by the processor, whereby the control device is operative to: —select a set of antenna elements comprising two neighboring antenna elements of the first subarray and two neighboring antenna elements of the second subarray, measure: in a selected antenna element of the first subarray a first received signal $Y_{31}$ as transmitted from the other selected antenna element of the first subarray 2a and a second received signal $Y_{34}$ as transmitted from the neighboring antenna element of the second subarray, and in a selected antenna element of the second subarray a third received signal $Y_{21}$ as transmitted from the other selected antenna element of the second subarray and a fourth received signal $Y_{24}$ as transmitted from the neighboring antenna element of the first subarray, calculate for the first calibrated subarray a downlink compensation value $\Delta t_a$ and an uplink compensation value $\Delta r_a$ based on measurement values obtained from the measuring, each compensation value $\Delta t_a$, $\Delta r_a$ having a positive and a negative solution, determine a first compensation value estimate, $k_t$, for downlink compensation and a second compensation value estimate, $k_r$, for uplink compensation, and determine the sign of the downlink compensation value $\Delta t_a$ and the uplink compensation value $\Delta r_a$ based on distance between the first compensation value estimate $k_t$ and the downlink compensation value, $\Delta t_a$, and the distance between the second compensation value estimate, $k_r$, and the uplink compensation value $\Delta r_a$.

In an embodiment, the control device 30 is configured to determine the sign of the calibration downlink compensation value $\Delta t_a$ by determining the absolute value of the difference between the determined compensation value estimate $k_t$ and the positive compensation value $\Delta t_a^+$ and the absolute value of the difference between the determined compensation value estimate $k_t$ and the negative compensation value $\Delta t_a^-$, and determining the sign of the calibration downlink compensation $\Delta t_a$ to be positive if the absolute value of the difference between the determined compensation value estimate $k_t$ and the positive compensation value $\Delta t_a^+$ is smaller than the absolute value of the difference between the determined compensation value estimate $k_t$ and the negative compensation value $\Delta t_a^-$, and else determining the sign of the calibration downlink compensation $\Delta t_a$ to be negative.

In various embodiments, the control device 30 is configured to calculate for the first calibrated subarray 2a a downlink compensation value $\Delta t_a$ and an uplink compensation value $\Delta r_a$ based on the measurements by using equations:

$$\Delta t_a = \pm \sqrt{\frac{Y_{31} \cdot Y_{21}}{Y_{24} \cdot Y_{34}}}$$

$$\Delta r_a = \pm \sqrt{\frac{Y_{31} \cdot Y_{34}}{Y_{24} \cdot Y_{21}}},$$

wherein $Y_{ij}$ are the values of the measurements performed using the selected set of antenna elements.

In various embodiments, the control device 30 is configured to determine the sign of the calibration compensation for the first subarray 2a by using equations:

$$\Delta t = \begin{cases} +\sqrt{\frac{Y_{31} \cdot Y_{21}}{Y_{24} \cdot Y_{34}}}, & \text{if } |k_t - \Delta t_a^+| < |k_t - \Delta t_a^-| \\ -\sqrt{\frac{Y_{31} \cdot Y_{21}}{Y_{24} \cdot Y_{34}}}, & \text{if } |k_t - \Delta t_a^+| \geq |k_t - \Delta t_a^-| \end{cases} \quad [13]$$

$$\Delta r = \begin{cases} +\sqrt{\frac{Y_{31} \cdot Y_{34}}{Y_{24} \cdot Y_{21}}}, & \text{if } |k_r - \Delta r_a^+| < |k_r - \Delta r_a^-| \\ -\sqrt{\frac{Y_{31} \cdot Y_{34}}{Y_{24} \cdot Y_{21}}}, & \text{if } |k_r - \Delta r_a^+| \geq |k_r - \Delta r_a^-| \end{cases}, \quad [14]$$

wherein $Y_{ij}$ are the values of the measurements performed using the selected set of antenna elements, $\Delta t_a$ is the downlink compensation value and $\Delta r_a$ is the uplink compensation value.

In various embodiments, the control device 30 is configured to determine the first compensation value estimate, $k_t$, for downlink compensation and the second compensation value estimate, $k_r$, for uplink, by using equations:

$$k_t = \frac{C_2 \cdot Y_{31}}{C_1 \cdot Y_{34}}$$

$$k_r = \frac{C_2 \cdot Y_{31}}{C_1 \cdot Y_{21}},$$

wherein $C_1$ is the mutual coupling between the selected two neighboring elements of the same subarray 2a, 2b and $C_2$ is the mutual coupling between a selected antenna element of the first subarray 2a and an neighboring antenna element of the second subarray 2b.

In various embodiments, the control device 30 is configured to obtain the mutual couplings $C_1$, C2 by s-parameter measurements or by software simulations.

In various embodiments, the control device 30 is configured to use the calibration downlink compensation value $\Delta t_a$ and the uplink compensation value $\Delta r_a$ for calibrating the first subarray 2a with the determined sign, hence obtaining array calibration between the first and second subarrays 2a, 2b.

The present teachings also encompass a computer program 33 for a control device 30 for determining sign of calibration compensation. The computer program 33 comprises computer program code, which, when executed on at least one processor on the control device 30, causes the control device 30 to perform the method 20 according to any of the described embodiments.

The present teachings also encompass computer program products 32 for a control device 30. The computer program product 32 comprises the computer program 33 for implementing the embodiments of the methods as described, and a computer readable means on which the computer program 33 is stored. The computer program product, or the memory, thus comprises instructions executable by the processor 30. Such instructions may be comprised in a computer program, or in one or more software modules or function modules. The computer program product 32 may, as mentioned earlier, be any combination of random access memory (RAM) or read only memory (ROM), Flash memory, magnetic tape, Compact Disc (CD)-ROM, digital versatile disc (DVD), Blu-ray disc etc.

Figure 6:
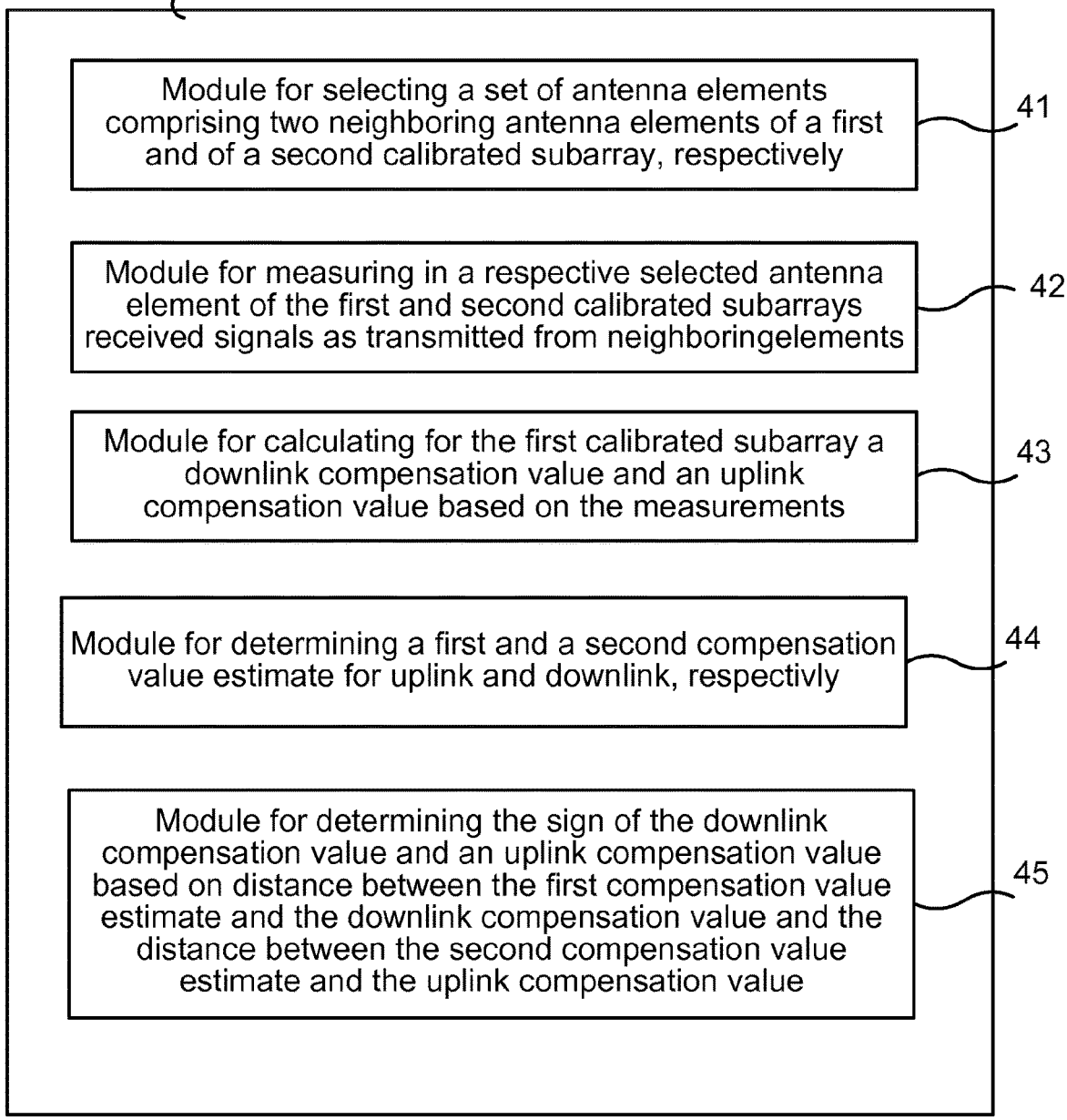
FIG. 6 illustrates a network device comprising function modules/software modules for implementing embodiments of the present teachings.

FIG. 6 illustrates a network device comprising function modules/software modules for implementing embodiments of the present teachings. The function modules can be implemented using software instructions such as computer program executing in a processor and/or using hardware, such as application specific integrated circuits (ASICs), field programmable gate arrays, discrete logical components etc., and any combination thereof. Processing circuitry may be provided, which may be adaptable and in particular adapted to perform any of the steps of the method 10 that has been described in various embodiments.

A control device is provided for determining sign of a calibration compensation for use in an antenna system. The antenna system comprises a first individually calibrated subarray and a second individually calibrated subarray. The control device comprises a first module 41 for selecting a set of antenna elements comprising two neighboring antenna elements of the first subarray and two neighboring antenna elements of the second subarray. Such first module 41 may, for instance, comprise processing circuitry adapted to select antenna elements, e.g. according to some sequence of instructions.

The control device comprises a second module 42 for measuring: in a selected antenna element of the first subarray a first received signal $Y_{31}$ as transmitted from the other selected antenna element of the first subarray and a second received signal $Y_{34}$ as transmitted from the neighboring antenna element of the second subarray, and in a selected antenna element of the second subarray a third received signal $Y_{21}$ as transmitted from the other selected antenna element of the second subarray and a fourth received signal $Y_{24}$ as transmitted from the neighboring antenna element of the first subarray.

Such second module 42 may, for instance, comprise processing circuitry adapted to receive and measure signals.

The control device comprises a third module 43 for calculating for the first calibrated subarray a downlink compensation value $\Delta t_a$ and an uplink compensation value $r_a$ based on measurement values obtained from the measuring, each compensation value $\Delta t_a$, $\Delta r_a$ having a positive and a negative solution. Such third module 43 may, for instance, comprise processing circuitry adapted to calculate compensation values based on received values.

The control device comprises a fourth module 44 for determining a first compensation value estimate, $k_t$, for downlink compensation and a second compensation value estimate, $k_r$, for uplink compensation. Such fourth module 44 may, for instance, comprise processing circuitry adapted for such determining.

The control device comprises a fifth module 45 for determining the sign of the downlink compensation value $\Delta t_a$ and the uplink compensation value $\Delta r_a$ based on distance between the first compensation value estimate $k_t$ and the downlink compensation value, $\Delta t_a$, and the distance between the second compensation value estimate, $k_r$, and the uplink compensation value $\Delta r_a$. Such fifth module 45 may, for instance, comprise processing circuitry adapted for such determining.

It is noted that one or more of the modules 41, 42, 43, 44, 45 may be replaced by units.

The invention has mainly been described herein with reference to a few embodiments. However, as is appreciated by a person skilled in the art, other embodiments than the particular ones disclosed herein are equally possible within the scope of the invention, as defined by the appended patent claims.

The invention claimed is:

1. A method of determining sign of a calibration compensation for use in an antenna system, the antenna system comprising a first individually calibrated subarray and a second individually calibrated subarray, the method being performed in a control device and comprising:
   selecting a set of antenna elements comprising two neighboring antenna elements of the first subarray and two neighboring antenna elements of the second subarray;
   measuring: in a selected antenna element of the first subarray a first received signal $Y_{31}$ as transmitted from the other selected antenna element of the first subarray and a second received signal $Y_{34}$ as transmitted from the neighboring antenna element of the second subarray, and in a selected antenna element of the second subarray a third received signal $Y_{21}$ as transmitted from the other selected antenna element of the second subarray and a fourth received signal $Y_{24}$ as transmitted from the neighboring antenna element of the first subarray;
   calculating for the first calibrated subarray a downlink compensation value $\Delta t_a$ and an uplink compensation value $\Delta r_a$ based on measurement values obtained from the measuring, each compensation value $\Delta t_a$, $\Delta r_a$ having a positive and a negative solution;
   determining a first compensation value estimate, $k_t$, for downlink compensation and a second compensation value estimate, $k_r$, for uplink compensation; and
   determining the sign of the downlink compensation value $\Delta t_a$ and the uplink compensation value $r_a$ based on distance between the first compensation value estimate $k_t$ and the downlink compensation value, $\Delta t_a$, and the distance between the second compensation value estimate, $k_r$, and the uplink compensation value $\Delta r_a$.

2. The method of claim 1, wherein the determining the sign of the calibration downlink compensation value $\Delta t_a$ comprises determining the absolute value of the difference between the determined compensation value estimate $k_t$ and the positive compensation value $\Delta t_a^+$ and the absolute value of the difference between the determined compensation value estimate $k_t$ and the negative compensation value $\Delta t_a^-$, and determining the sign of the calibration downlink compensation $\Delta t_a$ to be positive if the absolute value of the difference between the determined compensation value estimate $k_t$ and the positive compensation value $\Delta t_a^+$ is smaller than the absolute value of the difference between the determined compensation value estimate $k_t$ and the negative compensation value $\Delta t_a^-$, and else determining the sign of the calibration downlink compensation $\Delta t_a$ to be negative.

3. The method of claim 1, wherein the calculating for the first calibrated subarray a downlink compensation value $\Delta t_a$ and an uplink compensation value $\Delta r_a$ based on the measurements comprises using equations:

$$\Delta t_a = \pm \sqrt{\frac{Y_{31} \cdot Y_{21}}{Y_{24} \cdot Y_{34}}}$$

$$\Delta r_a = \pm \sqrt{\frac{Y_{31} \cdot Y_{34}}{Y_{24} \cdot Y_{21}}},$$

wherein $Y_{ij}$ are the values of the measurements performed using the selected set of antenna elements.

4. The method of claim 1, wherein the determining the sign of the calibration compensation for the first subarray comprises using equations:

$$\Delta t = \begin{cases} +\sqrt{\frac{Y_{31} \cdot Y_{21}}{Y_{24} \cdot Y_{34}}}, & \text{if } |k_t - \Delta t_a^+| < |k_t - \Delta t_a^-| \\ -\sqrt{\frac{Y_{31} \cdot Y_{21}}{Y_{24} \cdot Y_{34}}}, & \text{if } |k_t - \Delta t_a^+| \geq |k_t - \Delta t_a^-| \end{cases} \quad [13]$$

$$\Delta r = \begin{cases} +\sqrt{\frac{Y_{31} \cdot Y_{34}}{Y_{24} \cdot Y_{21}}}, & \text{if } |k_r - \Delta r_a^+| < |k_r - \Delta r_a^-| \\ -\sqrt{\frac{Y_{31} \cdot Y_{34}}{Y_{24} \cdot Y_{21}}}, & \text{if } |k_r - \Delta r_a^+| \geq |k_r - \Delta r_a^-| \end{cases} \quad [14]$$

wherein
$Y_{ij}$ are the values of the measurements performed using the selected set of antenna elements, $$\Delta t_a^+ = +\sqrt{\frac{Y_{31} \cdot Y_{21}}{Y_{24} \cdot Y_{34}}},$$

$$\Delta t_a^- = -\sqrt{\frac{Y_{31} \cdot Y_{21}}{Y_{24} \cdot Y_{34}}},$$

$$\Delta r_a^+ = +\sqrt{\frac{Y_{31} \cdot Y_{34}}{Y_{24} Y_{21}}}, \text{ and}$$

$$\Delta r_a^- = -\sqrt{\frac{Y_{31} \cdot Y_{34}}{Y_{24} \cdot Y_{21}}}.$$

5. The method of claim 1, wherein the determining the first compensation value estimate, $k_t$, for downlink compensation and the second compensation value estimate, $k_t$, for uplink, comprises using equations:

$$k_t = \frac{C_2 \cdot Y_{31}}{C_1 \cdot Y_{34}}$$

$$k_r = \frac{C_2 \cdot Y_{31}}{C_1 \cdot Y_{21}},$$

wherein $C_1$ is the mutual coupling between the selected two neighboring elements of the same subarray and $C_2$ is the mutual coupling between a selected antenna element of the first subarray and an neighboring antenna element of the second subarray.

6. The method of claim 5, comprising obtaining the mutual couplings $C_1$, $C2$ by s-parameter measurements or by software simulations.

7. The method of claim 1, comprising using the calibration downlink compensation value $\Delta t_a$ and the uplink compensation value $\Delta r_a$ for calibrating the first subarray with the determined sign, hence obtaining array calibration between the first and second subarrays.

8. A computer program product comprising a non-transitory computer readable medium storing a computer program for a control device for determining sign of antenna calibration compensation, the computer program comprising computer program code, which, when executed on at least one processor on the control device causes the control device to perform the method of claim 1.

9. A control device for determining sign of a calibration compensation for use in an antenna system, the antenna system comprising a first individually calibrated subarray and a second individually calibrated subarray, the control device being configured to:
select a set of antenna elements comprising two neighboring antenna elements of the first subarray and two neighboring antenna elements of the second subarray, measure:
in a selected antenna element of the first subarray a first received signal $Y_{31}$ as transmitted from the other selected antenna element of the first subarray and a second received signal $Y_{34}$ as transmitted from the neighboring antenna element of the second subarray, and
in a selected antenna element of the second subarray a third received signal $Y_{21}$ as transmitted from the other selected antenna element of the second subarray and a fourth received signal $Y_{24}$ as transmitted from the neighboring antenna element of the first subarray, calculate for the first calibrated subarray a downlink compensation value $\Delta t_a$ and an uplink compensation value $\Delta r_a$ based on measurement values obtained from the measuring, each compensation value $\Delta t_a$, $\Delta r_a$ having a positive and a negative solution, determine a first compensation value estimate, $k_t$, for downlink compensation and a second compensation value estimate, $k_r$, for uplink compensation, and determine the sign of the downlink compensation value $\Delta t_a$ and the uplink compensation value $\Delta r_a$ based on distance between the first compensation value estimate $k_t$ and the downlink compensation value, $\Delta t_a$, and the distance between the second compensation value estimate, $k_r$, and the uplink compensation value $\Delta r_a$.

10. The control device of claim 9, configured to determining the sign of the calibration downlink compensation value $\Delta t_a$ by determining the absolute value of the difference between the determined compensation value estimate $k_t$ and the positive compensation value $\Delta t_a^+$ and the absolute value of the difference between the determined compensation value estimate $k_t$ and the negative compensation value $\Delta t_a^-$, and determining the sign of the calibration downlink compensation $\Delta t_a$ to be positive if the absolute value of the difference between the determined compensation value estimate $k_t$ and the positive compensation value $\Delta t_a^+$ is smaller than the absolute value of the difference between the determined compensation value estimate $k_t$ and the negative compensation value $\Delta t_a^-$, and else determining the sign of the calibration downlink compensation $\Delta t_a$ to be negative.

11. The control device of claim 9, configured to calculate for the first calibrated subarray a downlink compensation value $\Delta t_a$ and an uplink compensation value $\Delta r_a$ based on the measurements by using equations:

$$\Delta t_a = \pm \sqrt{\frac{Y_{31} \cdot Y_{21}}{Y_{24} \cdot Y_{34}}}$$

$$\Delta r_a = \pm \sqrt{\frac{Y_{31} \cdot Y_{34}}{Y_{24} \cdot Y_{21}}},$$

wherein $Y_{ij}$ are the values of the measurements performed using the selected set of antenna elements.

12. The control device of claim 9 configured to determine the sign of the calibration compensation for the first subarray by using equations:

$$\Delta t = \begin{cases} +\sqrt{\frac{Y_{31} \cdot Y_{21}}{Y_{24} \cdot Y_{34}}}, & \text{if } |k_t - \Delta t_a^+| < |k_t - \Delta t_a^-| \\ -\sqrt{\frac{Y_{31} \cdot Y_{21}}{Y_{24} \cdot Y_{34}}}, & \text{if } |k_t - \Delta t_a^+| \geq |k_t - \Delta t_a^-| \end{cases} \quad [13]$$

$$\Delta r = \begin{cases} +\sqrt{\frac{Y_{31} \cdot Y_{34}}{Y_{24} \cdot Y_{21}}}, & \text{if } |k_r - \Delta r_a^+| < |k_r - \Delta r_a^-| \\ -\sqrt{\frac{Y_{31} \cdot Y_{34}}{Y_{24} \cdot Y_{21}}}, & \text{if } |k_r - \Delta r_a^+| \geq |k_r - \Delta r_a^-| \end{cases} \quad [14]$$

wherein $Y_{ij}$ are the values of the measurements performed using the selected set of antenna elements, $$\Delta t_a^+ = +\sqrt{\frac{Y_{31} \cdot Y_{21}}{Y_{24} \cdot Y_{34}}},$$

$$\Delta t_a^- = -\sqrt{\frac{Y_{31} \cdot Y_{21}}{Y_{24} \cdot Y_{34}}},$$

$$\Delta r_a^+ = +\sqrt{\frac{Y_{31} \cdot Y_{34}}{Y_{24} Y_{21}}}, \text{ and}$$

$$\Delta r_a^- = -\sqrt{\frac{Y_{31} \cdot Y_{34}}{Y_{24} \cdot Y_{21}}}.$$

13. The control device of claim 9, configured to determine the first compensation value estimate, $k_t$, for downlink compensation and the second compensation value estimate, $k_r$, for uplink, by using equations:

$$k_t = \frac{C_2 \cdot Y_{31}}{C_1 \cdot Y_{34}},$$

$$k_r = \frac{C_2 \cdot Y_{31}}{C_1 \cdot Y_{21}},$$

wherein $C_1$ is the mutual coupling between the selected two neighboring elements of the same subarray and $C_2$ is the mutual coupling between a selected antenna element of the first subarray and an neighboring antenna element of the second subarray.

14. The control device of claim 13, configured to obtain the mutual couplings $C_1$, C2 by s-parameter measurements or by software simulations.

15. The control device of claim 14, configured to use the calibration downlink compensation value $\Delta t_a$ and the uplink compensation value $\Delta r_a$ for calibrating the first subarray with the determined sign, hence obtaining array calibration between the first and second subarrays.

* * * * *